United States Patent
Ahmed

(10) Patent No.: US 7,653,362 B2
(45) Date of Patent: Jan. 26, 2010

(54) METHOD AND APPARATUS FOR ON-CHIP MEASUREMENT OF POWER AMPLIFIER AM/AM AND AM/PM NON-LINEARITY

(75) Inventor: Walid K. M. Ahmed, Tinton Falls, NJ (US)

(73) Assignee: Pine Valley Investments, Inc., Las Vegas, NV (US)

( * ) Notice: Subject to any disclaimer, the term of this patent is extended or adjusted under 35 U.S.C. 154(b) by 600 days.

(21) Appl. No.: 11/377,851

(22) Filed: Mar. 16, 2006

(65) Prior Publication Data

US 2007/0216554 A1  Sep. 20, 2007

(51) Int. Cl.
*H04B 1/04* (2006.01)
*H01Q 11/12* (2006.01)

(52) U.S. Cl. .............. 455/91; 455/114.2; 455/126; 375/296

(58) Field of Classification Search ... 455/114.2–114.3, 455/126, 127.1–127.2; 375/296–297; 330/149
See application file for complete search history.

(56) References Cited

U.S. PATENT DOCUMENTS

| | | | |
|---|---|---|---|
| 5,742,201 A | 4/1998 | Eisenberg et al. | |
| 5,959,499 A * | 9/1999 | Khan et al. | 330/149 |
| 6,043,707 A | 3/2000 | Budnik | |
| 6,313,703 B1 * | 11/2001 | Wright et al. | 330/149 |
| 6,449,465 B1 | 9/2002 | Gailus et al. | |
| 6,476,670 B1 * | 11/2002 | Wright et al. | 330/2 |
| 6,587,513 B1 * | 7/2003 | Ichihara | 375/296 |
| 6,633,199 B2 | 10/2003 | Nielsen et al. | |
| 6,924,699 B2 | 8/2005 | Ahmed | |
| 6,949,976 B2 * | 9/2005 | Funyu et al. | 330/149 |
| 6,980,604 B2 * | 12/2005 | Kubo et al. | 375/296 |
| 6,999,523 B2 * | 2/2006 | Posti | 375/296 |
| 7,062,236 B2 | 6/2006 | Midtgaard et al. | |
| 7,193,462 B2 * | 3/2007 | Braithwaite | 330/149 |
| 7,321,264 B2 * | 1/2008 | Kokkeler | 330/149 |
| 2003/0156658 A1 | 8/2003 | Dartois | |
| 2003/0179831 A1 * | 9/2003 | Gupta et al. | 375/296 |
| 2003/0184374 A1 | 10/2003 | Huang et al. | |
| 2005/0242876 A1 * | 11/2005 | Obernosterer | 330/149 |
| 2007/0182484 A1 * | 8/2007 | Fonden et al. | 330/149 |

FOREIGN PATENT DOCUMENTS

| | | |
|---|---|---|
| EP | 1 199 814 A1 | 4/2002 |
| EP | 1 331 729 A1 | 7/2003 |
| GB | 2 400 996 A | 10/2004 |

\* cited by examiner

*Primary Examiner*—Simon D Nguyen
(74) *Attorney, Agent, or Firm*—Allen, Dyer, Doppelt, Milbrath & Gilchrist, P.A.

(57) ABSTRACT

An apparatus and method for characterizing an amplifier transmitting a band limited signal using a sample of the input signal to the amplifier and a sample of the output signal from the amplifier, where the output signal is sub-sampled. The sub-sampling frequency is chosen such that images of the band limited signal do not overlap. The input signal and the output signal in a polar format are processed to determine characteristics such AM/AM and AM/PM conversion nonlinearities.

20 Claims, 2 Drawing Sheets

METHOD AND APPARATUS FOR ON-CHIP MEASUREMENT OF POWER AMPLIFIER AM/AM AND AM/PM NON-LINEARITY

TECHNICAL FIELD

The present application relates to the performance of radio frequency amplifiers, and more particularly to the measurement and characterization of distortion.

BACKGROUND

Generally power amplifiers are characterized by such factors as gain, input noise figure, bandwidth, operating frequency, and distortion characteristics. The distortion characteristics may be expressed as second and third order intercept points, and by AM/AM and AM/PM conversion characteristics. Usually these characteristics are determined during the development and production test of the amplifiers, and are not measured when the amplifier is in operation in a transmitter or other device.

In part, these measurements are not performed in normal operation as most of the measuring techniques involve interruption of the transmissions or require use of an unmodulated signal.

SUMMARY

A device for characterizing an amplifier for transmitting a band limited signal is described, including a sub-sampling module coupled to an output of the amplifier, and a distortion analyzer, where the sub-sampling module is configured to sample the output of the amplifier at a data rate less than a center frequency of the transmitted signal.

Further, a method of measuring distortion in an amplifier for transmitting a band limited signal includes coupling a sample of an output of the amplifier, converting the coupled signal from an analog signal to a digital signal using an analog-to-digital converter, and formatting the digital signal in a polar coordinate system comprising amplitude and phase data; obtaining a digital sample of the signal input to the amplifier and formatting the digital signal input sample in a polar coordinate system comprising amplitude and phase data, and where the sampling frequency of the analog-to-digital converter is chosen such that baseband signal images of the band-limited transmitted signal are separated in frequency by greater than a bandwidth of the transmitted signal.

DETAILED DESCRIPTION

Figure 1:
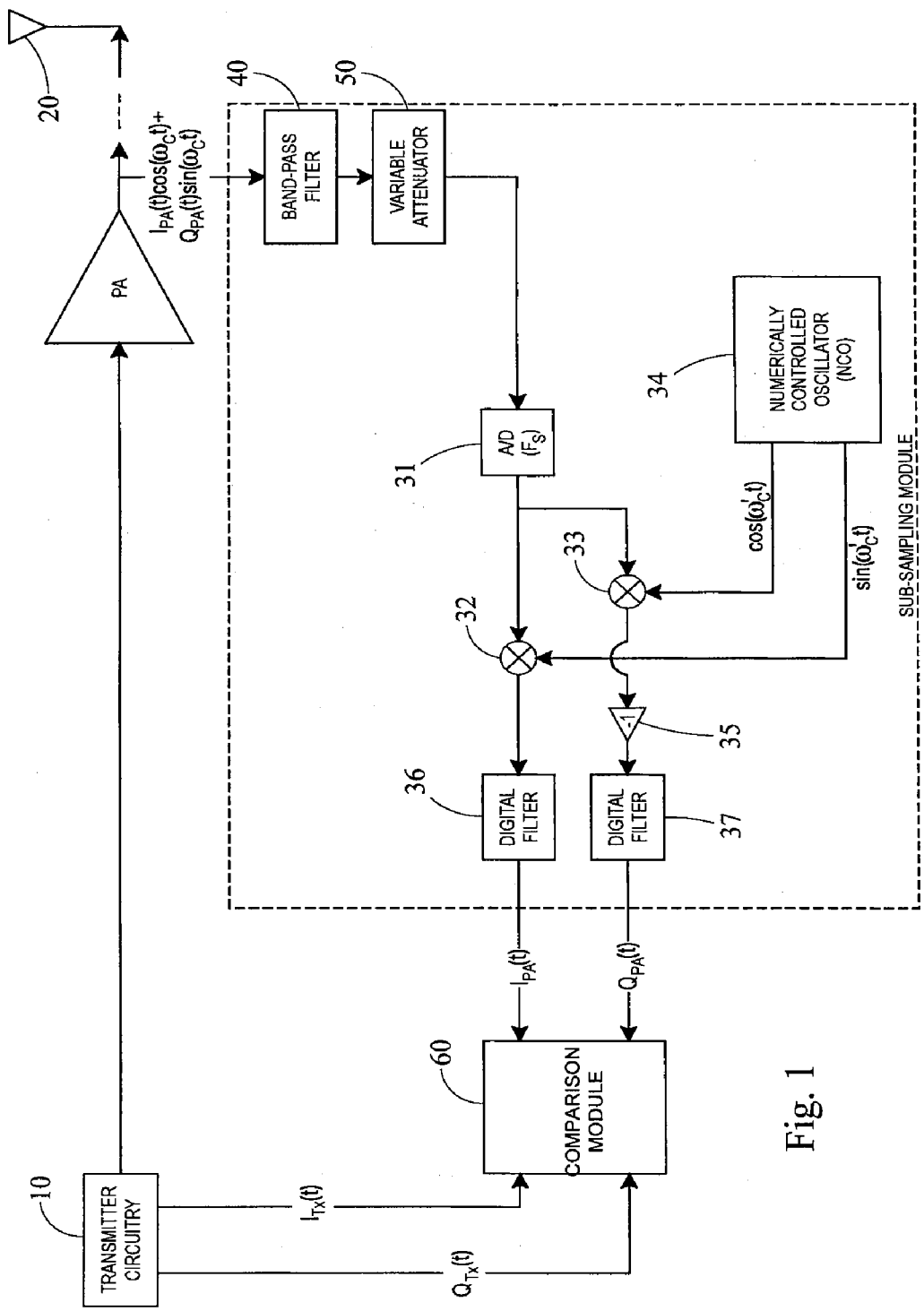
FIG. 1 is a block diagram showing direct sub-sampling of an amplifier signal.

Exemplary embodiments of the invention may be better understood with reference to the drawings, but these embodiments are not intended to be of a limiting nature. Rather, the invention is to cover all modifications, equivalents, and alternatives falling within the spirit and scope of the invention which is set forth by the claims.

An apparatus and method is described for the measurement of amplifier non-linearity and transfer function using components which may be integrated with the amplifier in an integrated circuit package. The amplifier may be a power amplifier (PA) and among the non-linearity types which may be measured are AM/AM and AM/PM.

Where the amplified signal is characterized as being band limited, a sample of the output of the amplifier signal is applied to an analog-to-digital converter (ADC). The sampling rate of the ADC is selected such that sub-sampling of the center frequency of the transmitted signal is performed and the sampling frequency is chosen so that the aliased images of a band limited signal at the center frequency do not overlap. In this manner a sample of the band limited signal is obtained and the characteristics of the signal within the band limited frequency regime may be determined unambiguously by digital signal processing.

A bandpass or a lowpass filter may be inserted between the transmitted output and the ADC input so as to prevent spurious signals such as harmonic distortion from being aliased into the analysis bandwidth. Such filters may, however, be omitted providing that the distortion products are small in amplitude with respect to the signals being analyzed. In addition, a variable attenuator, which attenuation may be adjusted either continually or in steps, may be provided between the amplifier output and the ADC input so that amplifier output signals over a wide range of amplitudes may be digitized by an ADC having a lesser overall dynamic range.

The ADC data may be converted to in-phase and quadrature signals by a number of known techniques. In an aspect, the ADC data, at a word rate equal to the sampling frequency, is multiplied by an in-phase and a quadrature signal at a frequency selected such that the band limited signal is translated to be symmetrical with respect to zero frequency. This results in a time series of in-phase and quadrature samples.

Similarly, a digital representation of the signal input to the amplifier is obtained from the transmitter circuitry. The digital representation of the signal input may be obtained in a similar manner to the amplifier output data, or baseband modulation and data signals may be used. The digital representation of the signal input and the signal output may then be directly compared to determine the effect of the amplifier on the signal characteristics.

In an aspect, the in-phase and quadrature representations of the signal data are converted into a polar format, a polar format being a time series of amplitude and phase data. The difference in amplitude between the input signal and the output signal is determined, and the data output are stored as a two dimensional vector, where one dimension is the input signal amplitude and the second dimension is the difference between the input signal and output signal amplitude. In another aspect, the phase difference between the input phase and the output phase is determined, and the data output are stored as a two dimensional vector, where one dimension is the input signal amplitude and the other dimension is the difference between the input signal phase and the output signal phase.

In yet another aspect, a downconversion of the amplifier output signal is performed to a frequency intermediate between the center frequency of the amplified signal and that of the sampling frequency of the ADC The processing of a signal may be performed by either analog or digital circuits, or a combination thereof. The signal processing also may be performed by one or more computers with associated memory and computer code which performs mathematical operations and functions equivalent to that performed by the analog or digital circuits. Herein, there is not intended to be a restriction of the type of circuit which performs each function, or the combination of types of circuits which may be used, although the examples may mention a specific type of circuit in the description thereof.

In an aspect where a computer or a digital circuit is used, the signal may be converted from analog format to a digital representation thereof in an analog-to-digital (A/D) converter, as is known in the art. The A/D conversion process may be performed at any point in the system. The choice of location of the A/D conversion will depend on the specific application.

The amplifier PA may be any of the type of radio frequency amplifiers used to increase the power of an input signal for purposes of radiating a signal. The output of the PA is intended to be coupled to an antenna for performing the function of transmitting a signal. A sample of the PA output signal is coupled to the sub-sampling module. The coupling means may be any radio frequency coupling technique which does not substantially change the output characteristics of the power amplifier. This may be a directional coupler, a high value resistor, a capacitive coupler, or the like.

FIG. 1 illustrates a transmitting arrangement showing a power amplifier PA having an output to an antenna, and a portion of the output coupled to a sub-sampling module. Transmitter circuitry 10 may be provided to generate the signal waveform to be amplified by the PA and radiated by the antenna 20. The transmitter circuitry 10 may be combined with the PA and the sub-sampling module 30 or provided separately. Furthermore the output of the sub-sampling module 30 may be processed within the device circuit or by separate circuitry.

The sub-sampling module 30 is configured to perform direct sub-sampling of the radio frequency signal emitted by the PA. That is, the sampling rate analog-to-digital conversion is at a rate that does not satisfy the Nyquist sampling theorem, being less than that required to ensure unambiguous representation of the signal. In particular, the sampling rate is chosen such that it is approximately a sub-multiple of the center frequency of the band-limited transmitted signal. In this manner, aliasing of the signal that occurs due to violation of the Nyquist sampling theorem results in a series of non-overlapping replicas of the bandpass signal, including a replica disposed about zero frequency (baseband).

For purposes of discussion, the signal or the result of a bandpass filtering operation performed on the signal is said to have a bandwidth B. This is usually idealized as a filter or a spectrum that has a normalized amplitude of unity within $\pm B/2$ of a center frequency $f_c$, and an amplitude of zero outside of that band. In practice, all such filters or modulations have some amount of energy transmission outside of the bandwidth B, and the actual value of the bandwidth used for the purposes of anti-aliasing design will be somewhat greater, the actual value being determined by the fidelity of the analysis desired. These considerations will be well known to those skilled in the art.

The transmitted signal is expected to be a bandpass-limited energy spectrum. However, due to non-linearities occurring in practice, various second- and third-order distortions occur, which result in spurious signals being generated. For example, in the case of second-order distortion, spurious signals may be generated at integer multiples of the transmitted frequencies. Consequently, a bandpass filter 40 is provided such that the spurious signals are suppressed by the out-of-band attenuation properties of the bandpass filter, thus meeting the requirement of a band-limited signal for the undersampling process. Alternatively, as the predominant effect of transmitted distortion on the transmitted waveform is to produce signals at approximately integer multiples of the center frequency $f_c$, a low pass filter having a cut-off frequency greater than that of the center frequency could also be used. In some circumstances, where the amplitude of the distortion signals is small compared with the expected measured signal, the filter may be omitted entirely.

The amplitude range of signals emitted by the PA may be quite wide, encompassing at least the linear dynamic range of the amplifier. For digital signal processing, the analog-to-digital converters are intended to transform an analog signal into a digital representation thereof. However, the potentially large range of transmitted signal amplitudes may place difficult requirements on the analog-to-digital converter (ADC) 31. On the lower end of this range, there may be effectively no signal input to the PA, and the output signal is merely the input noise figure of the amplifier, amplified by the gain of the power amplifier PA, which may be a very small signal. The upper end of the range may be an input signal which, when amplified by the power amplifier PA, produces an output signal corresponding to the maximum power output capability of the amplifier. To reduce the dynamic range requirements on the ADC 31, an attenuator 50 may be placed in the signal path, either after the bandpass filter 40, as shown, or alternatively before the bandpass filter. The attenuation value of the attenuator 50 may be controlled such that the maximum amplitude of the signal at the input to the ADC 31 falls within the design range of the ADC. Control of the attenuator 50 may be by reference to the signal value input to the PA, by measurement of overflow of the ADC converter when the maximum amplitude range is exceeded, or by analysis of the generated signal to be applied to the PA, as examples.

ADC 31 converts the analog signal to a time series of digital data words which may be processed by digital logic, by a microprocessor, by an array processor or any similar device. The capabilities of the device in terms of processing speed depends on the sampling rate of the ADC and whether the processing is performed continually or on a time limited sample of data.

The signal at the input of the ADC 31 may have been band-limited by the bandpass filter 40 so that undesirable signals such as harmonics are not aliased into the desired signal. This permits the modulation characteristics of the transmitted signal to be ascertained by typical digital signal processing techniques.

Because the function of the bandpass filter 40 is to eliminate spurious signals, the bandpass filter 40 may have a large percentage bandwidth with respect to the central frequency of transmitted signal. The bandwidth B of the input signal to the transmitted may be considerably less that the bandwidth of the bandpass filter 40, and this permits the bandpass filter 40 to perform the function of eliminating spurious signals for transmitted signals having a range of central frequencies. That is, the signal being amplified by the PA may occupy one of a plurality of channelized bands and still be within the filtering capability of the bandpass filter 40.

When a signal is band limited at baseband, the Nyquist sampling theorem may be modified, in that the sampling rate required is twice the maximum bandwidth of the signal being digitized. It will be appreciated that the sampling frequency which may be chosen may be much lower than it would be if the Nyquist theorem was applied to the transmitted signal itself. A wide variety of ADC sampling configurations may be used, but the composite sampling frequency of the one or more ADC used must meet the Nyquist theorem with respect to the bandwidth B of the signal to be analyzed if aliasing of the signal is to be avoided.

In FIG. 1, a sub-sampling technique known as an offset baseband type is used. In this aspect, a single ADC 31 is employed, and the signal is sampled at a rate such that the central frequency of the transmitted signal is translated to a frequency offset from zero by at least half of the bandwidth B.

The output of the ADC 31 is multiplied in each of two multipliers 32, 33 by reference signals at a frequency $f_c'$, where $f_c'+B \leq F_s/2$, the reference signals being 90 degrees out of phase with each other. The reference signals are generated, for example, in a numerically controlled oscillator 34, or stored as an array of digital values representing a sinusoid. This results in two digital data streams representing in-phase and quadrature (I and Q) samples of the transmitted signal. Such samples may be further processed by any of a variety of algorithms, as in known in the art, to unambiguously extract information on the characteristics of signal, or to filter and reconstruct the band limited signal.

An inverting computation, symbolized by reference designator 35 may be performed on one of the I or the Q signals in order to simplify later processing steps. The I and the Q data time series may be digitally filtered in filters 36 and 37 to facilitate further processing The I and Q outputs of the sub-sampling module are designated $I_{PA}(t)$ and $Q_{PA}(t)$ to indicate that the two streams of digital data represent the sampled output signal from the PA. The transmitter circuitry 10 generates or processes information to be modulated on the carrier and amplified by the PA. Some of the signal characteristics arise from the modulation format selected, such as spread spectrum characteristics, center frequency and the like, and some of the signal characteristics may arise from information content to be transmitted by the apparatus in which the amplifier module is contained. A baseband signal of I and Q samples representing the time-series of the signal from the transmitter circuitry is produced; these samples are designated $I_{TX}(t)$ and $Q_{TX}(t)$ and represent the low level signal input to the PA, which is considered to be the undistorted signal. At least at the comparison module, the data rate of the data series from the transmitted circuitry and the sub-sampling module are made to be equivalent so that the time series of data may be compared.

The comparison module 60 may process the data from the two data streams in a number of ways to determine the transfer function of the PA. Linear and non-linear characteristics may be determined, such as transfer function, AM/AM and AM/PM non-linearities. Such characterizations may be used to pre-distort the output of the transmitter circuitry 10 prior to input to the PA so that the data transmission characteristics may be improved.

In an example, the $I_{PA}(t)$ and the $Q_{PA}(t)$ data series is converted from I and Q data to amplitude and phase data. The result of this operation, which is a conventional manipulation of complex numbers, is a time series of signal amplitude $S_{PA}(t)$ and phase $P_{PA}(t)$ representing the sub-sampled output of the PA. Similarly, the $I_{TX}(t)$ and the $Q_{TX}(t)$ data series is converted from I and Q data to amplitude and phase data. The result of this conversion is a time series of signal amplitude $S_{TX}(t)$ and phase $P_{TX}(t)$ having the same data rate as the ADC signals. The amplitude and phase representation of data may be termed a polar format.

The polar format data may be used to determine the difference between the transmitter output amplitude time series, as modified by the PA and the input time series to the PA. Similarly, the phase difference between the transmitted phase, as modified by the PA and the input time series to the PA may be determined. In performing such comparisons, the effect of the gain of the amplifier, and the remainder of the signal chain in the sub-sampling module, including the attenuator value may be considered and the data values normalized.

In the case of the amplitude times series, the difference between the transmitter-circuitry-generated signal $S_{TX}(t)$ and the output of the power amplifier $S_{PA}(t)$ may be obtained on a sample-by sample basis, and this difference may be considered to represent the distortion of a signal by the PA. This result may be plotted as a function of the undistorted signal $S_{TX}(t)$ for further analysis. Similarly, the difference between the phase $P_{TX}(t)$ at the input of the PA and the phase at the output of the PA, $P_{PA}(t)$ may be computed and plotted as a function of the input amplitude $S_{TX}(t)$.

The results of the analysis may be used to construct or modify the parameters of algorithms in either the transmitter circuitry, or in a device disposed (not shown) between the transmitter circuitry 10 and the PA input so as to pre-distort the signal applied to the input of the PA to reduce or substantially eliminate the measured distortion. The parametric aspects of the pre-distortion circuitry may be adjusted periodically based on the measured results, as it may be expected that the distortion characteristics of the PA may vary with temperature, transmitted signal bandwidth and amplitude and the like.

Figure 2:
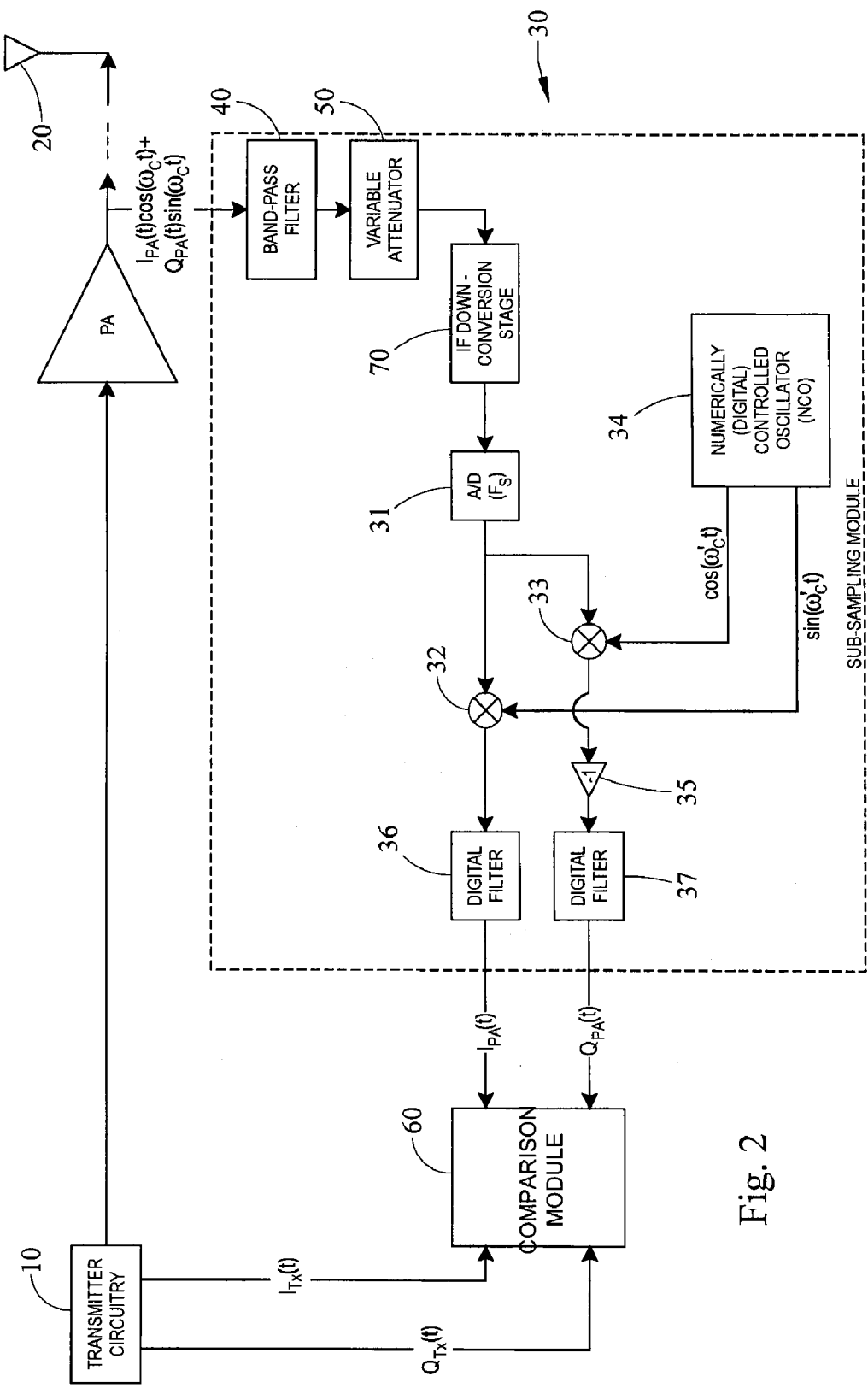
FIG. 2 is a block diagram showing intermediate frequency sub-sampling of an amplifier.

The ADC 32 may have a bandwidth that does not encompass the transmitted center frequency $f_c$, as the center frequency may be at a high radio frequency which is a substantial multiple of the sampling rate Fs. Providing an ADC 31 having a broad bandwidth and a suitable number of bits of digitization may be an economic consideration, and the use of a ADC 31 with less capability may be employed. In this situation, the PA output signal as coupled to the sub-sampling module is further processed in an IF downconversion unit 70 as shown in FIG. 2. This arrangement is similar to the arrangement of FIG. 1 and only the differences will be described.

The bandpass filter 40, variable attenuator 50 and the IF downconversion 70 module may be arranged in the sequence shown in FIG. 2, although other arrangements are possible. The input to the IF downconversion module 70 has a center frequency of $f_c$ representing the output of the PA. The IF downconversion module 70 translates the center frequency $f_c$ of the input signal to a new lower frequency $f_{cl}$, by mixing the signal with another signal of a suitable frequency in a mixer, as is known in the art and filtering the output of the mixer so as to suppress higher order mixing products. The downconverted signal is a representation of the transmitted band limited signal at the output of the bandpass filter, but at a lower central frequency, which may be suitable sub-sampling by the ADC 31 chosen. The selection of the sampling frequency $F_s$ of the ADC 31 is based on the same sub-sampling criteria that have previously been described, considering that the band limited signal is now centered about $f_{cl}$.

The number of bits required in the ADC is determined by criteria relating to the subsequent digital signal processing, and may typically be less than that representing the entire dynamic range of the transmitted signal. In an aspect this dynamic range may have been reduced by adjustment of the variable attenuator. As a criterion for determining the adequacy of an ADC, the signal at the input to the ADC may be sufficient to actuate a change in detected bit value at a sufficient rate to approximate the maximum bandwidth of the input signal. That is to say, the signal input, which may also include amplified transmitter noise has an amplitude greater than or equal to about one bit.

Although the present invention has been explained by way of the examples described above, it should be understood to the ordinary skilled person in the art that the invention is not limited to the examples, but rather that various changes or modifications thereof are possible without departing from the spirit of the invention. Accordingly, the scope of the invention shall be determined only by the appended claims and their equivalents.

What is claimed is:

1. A device for characterizing an amplifier for transmitting a band limited signal, comprising:
   a sub-sampling module coupled to an output of the amplifier; and
   a distortion analyzer;
   wherein the sub-sampling module is configured to sample a signal at a data rate less than a center frequency of the sampled signal; and, a sampling frequency of the sub-sampling module is selected such that baseband signal images of the band limited transmitted signal are separated in frequency by greater than a bandwidth of the transmitted signal.

2. The device of claim 1, wherein the distortion analyzer has a first input communicating with the sub-sampling module and a second input communicating with a signal generator.

3. The device of claim 2, wherein data input to the second input represents the signal generator output applied to an input of the amplifier.

4. The device of claim 2, wherein the data input to the first input represents the sub-sampled output of the amplifier.

5. The device of claim 2, wherein each of the data signals received by the first and the second inputs is converted from in-phase and quadrature format to polar format, the polar format comprising amplitude and phase data.

6. The device of claim 5, wherein the difference between the amplitude of the data from the first input and the data from the second input is computed and stored as a two dimensional vector data array in a memory, where the first dimension is the value of the difference, and the second dimension is the value of the first data input.

7. The device of claim 5, wherein the difference between the phase of the data from the first input and the phase of the data from the second input is computed and stored in a two dimensional vector array in a memory, where the first dimension is the value of the difference, and the second dimension is the value of the first data input.

8. The device of claim 1 wherein the sub-sampling module comprises:
   a bandpass filter;
   an analog-to-digital converter; and
   a quadrature converter.

9. The device of claim 1, further comprising a downconversion module inserted between the sub-sampling module and the amplifier output.

10. The device of claim 9, wherein the downconversion module is configured to convert a first center frequency of the signal at the output of the amplifier to a second center frequency lower than the first center frequency, and to filter the converted signal to suppress the amplitude of signals at frequencies greater than the second center frequency.

11. The device of claim 1, wherein an input signal to the amplifier is pre-distorted based on a measurement value obtained by the distortion analyzer.

12. The device of claim 11, wherein transmitter circuitry provides an input signal to the amplifier and the measurement value is determined by a comparison of the input signal from the transmitter circuitry with a signal output from the sub-sampling module.

13. The device of claim 12, wherein the measurement value represents at least one of amplitude modulation (AM/AM) distortion or amplitude-phase modulation (AM/PM) distortion.

14. A method of measuring distortion in an amplifier for transmitting a signal having a bandwidth, the method comprising:
   coupling a sample of an output signal of the amplifier;
   converting a signal from an analog signal to a digital signal using an analog-to-digital converter having a sampling frequency less than a center frequency of the signal being sampled;
   formatting the digital signal in a polar coordinate system comprising amplitude and phase data; and
   obtaining a digital sample of the signal input to the amplifier and formatting the digital signal input sample in a polar coordinate system comprising amplitude and phase data,
   wherein the sampling frequency of the analog-to-digital converter is chosen such that baseband signal images of the output signal are separated in frequency by greater than the bandwidth of the output signal.

15. The method of claim 14, further comprising forming the difference between the amplitude data from the amplifier output and the amplitude data from the amplifier input and storing the resultant difference value associated with the corresponding input amplitude value.

16. The method of claim 14, further comprising filtering the coupled sample in a bandpass filter to suppress out-of-band signals prior to analog-to-digital converting.

17. The method of claim 16, wherein the output of the bandpass filter is attenuated by an attenuator so that a maximum signal input capability of the analog-to-digital converter is not exceeded.

18. The method of claim 14, further comprising forming the difference between the phase data from the amplifier output and the phase data from the amplifier input and storing the resultant difference value with the corresponding input phase value.

19. The method of claim 14, further comprising converting a first center frequency of the transmitted signal to a second center frequency lower than the first center frequency, prior to analog-to-digital conversion.

20. The method of claim 14, wherein the center frequency of the frequency being sampled is a center frequency of the transmitted signal.

* * * * *